United States Patent
Wang et al.

(10) Patent No.: US 9,252,187 B2
(45) Date of Patent: Feb. 2, 2016

(54) DEVICES AND METHODS FOR MEASUREMENT OF MAGNETIC CHARACTERISTICS OF MRAM WAFERS USING MAGNETORESISTIVE TEST STRIPS

(71) Applicant: Avalanche Technology Inc., Fremont, CA (US)

(72) Inventors: Zihui Wang, Fremont, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 158 days.

(21) Appl. No.: 14/195,473

(22) Filed: Mar. 3, 2014

(65) Prior Publication Data

US 2014/0252356 A1 Sep. 11, 2014

Related U.S. Application Data

(60) Provisional application No. 61/774,941, filed on Mar. 8, 2013.

(51) Int. Cl.
*H01L 27/00* (2006.01)
*H01L 27/22* (2006.01)
(Continued)

(52) U.S. Cl.
CPC ........ *H01L 27/222* (2013.01); *G11C 29/50008* (2013.01); *H01L 22/34* (2013.01); *G01R 31/2648* (2013.01); *G11C 11/16* (2013.01); *G11C 2029/5002* (2013.01)

(58) Field of Classification Search
CPC ...... H01L 27/222; H01L 22/34; G11C 11/16; G11C 29/50008; G11C 2029/5002; G01R 31/2648
See application file for complete search history.

(56) References Cited

U.S. PATENT DOCUMENTS

| 6,927,569 B2 * | 8/2005 | Worledge | G01R 33/098 324/230 |
|---|---|---|---|
| 7,323,890 B2 | 1/2008 | Petersen et al. | |

(Continued)

OTHER PUBLICATIONS

D. C. Worledge and P. L. Trouilloud, Magnetoresistance measurement of unpatterned magnetic tunnel junction wafers by current-in-plane tunneling, Applied Physics Letters, vol. 83, No. 1, 7 Jul. 2003, pp. 84-86.

(Continued)

*Primary Examiner* — Caleb Henry
*Assistant Examiner* — Alexander Belousov
(74) *Attorney, Agent, or Firm* — G. Marlin Knight; Bing K. Yen (57) ABSTRACT

Methods for testing magnetoresistance of test devices with layer stacks, such as MTJs, fabricated on a wafer are described. The test devices can be fabricated along with arrays of similarly structured memory cells on a production wafer to allow in-process testing. The test devices with contact pads at opposite ends of the bottom electrode allow resistance across the bottom electrode to be measured as a surrogate for measuring resistance between the top and bottom electrodes. An MTJ test device according to the invention has a measurable magnetoresistance (MR) between the two contact pads that is a function of the magnetic orientation of the free layer and varies with the length and width of the MTJ strip in each test device. The set of test MTJs can include a selected range of lengths to allow the tunnel magnetoresistance (TMR) and resistance area product (RA) to be estimated or predicted.

9 Claims, 5 Drawing Sheets

(51) Int. Cl.
   *H01L 21/66* (2006.01)
   *G11C 29/50* (2006.01)
   *G01R 31/26* (2014.01)
   *G11C 11/16* (2006.01)

(56) References Cited

U.S. PATENT DOCUMENTS

| | | | |
|---|---|---|---|
| 7,732,881 | B2 | 6/2010 | Wang |
| 7,863,911 | B2 | 1/2011 | Hong et al. |
| 2009/0256220 | A1 | 10/2009 | Horng et al. |
| 2009/0285017 | A1 | 11/2009 | Yamane et al. |
| 2010/0023287 | A1 | 1/2010 | Worledge et al. |
| 2010/0033881 | A1 | 2/2010 | Carey et al. |
| 2010/0096716 | A1 | 4/2010 | Ranjan et al. |
| 2012/0326712 | A1 | 12/2012 | Tudosa et al. |
| 2013/0148417 | A1 | 6/2013 | Zhou et al. |
| 2013/0314982 | A1 | 11/2013 | Zhou et al. |

OTHER PUBLICATIONS

G. D. Fuchs, et al.; Spin-Torque Ferromagnetic Resonance Measurements of Damping in Nanomagnets; Applied Physics Letters vol. 91, 062507 2007; published online Aug. 7, 2007.

Yoshishige Suzuki and Hitoshi Kubota; Spin-Torque Diode Effect and Its Application; Journal of the Physical Society of Japan vol. 77, No. 3, Mar. 2008, 031002.

J. M. Beaujour, et al.; Ferromagnetic resonance linewidth in ultrathin films with perpendicular magnetic anisotropy Physical Review B 80, 180415 (R) 2009.

Mikihiko Oogane, et al.; Magnetic Damping in Ferromagnetic Thin Films; Japanese Journal of Applied Physics; vol. 45, No. 5A, 2006, pp. 3889-3891.

\* cited by examiner

1Q $$R = \frac{R_U l}{w} \cdot \frac{R_L}{R_L+R_U} - \frac{R_U}{w} \cdot \frac{R_U}{R_L+R_U} \cdot (e^{-\sqrt{\frac{R_L+R_U}{RA}} \cdot l} - 1) / \sqrt{\frac{R_L+R_U}{RA}}$$

DEVICES AND METHODS FOR MEASUREMENT OF MAGNETIC CHARACTERISTICS OF MRAM WAFERS USING MAGNETORESISTIVE TEST STRIPS

RELATED APPLICATION

Provisional Application 61/774,941 filed Mar. 7, 2013 is included by reference herein and benefit of the priority date is hereby claimed.

FIELD OF THE INVENTION

The present invention relates to the techniques for fabricating arrays of magnetoresistive random access memory (MRAM) cells such as those including magnetic tunnel junctions (MTJ) memory elements. The invention relates particularly to measurement of magnetic characteristics of in-process wafers for quality control, process optimization, as well as, testing during development.

BACKGROUND OF THE INVENTION

Magnetoresistive random access memory (MRAM) cells including magnetic tunnel junctions (MTJ) memory elements will be described as examples of devices that can be used with the method of the invention. MTJs can be designed with in-plane or perpendicular magnetization directions with respect to the film surface. The free magnetic layer in an MTJ memory element has a magnetization direction that is switchable in either of two directions. The resistivity of the whole MTJ layer stack changes when the magnetization of the free layer changes direction relative to that of the reference layer, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

The MRAM cells in an array on a chip are connected by metal word and bit lines. Each memory cell is connected to a word line and a bit line. The word lines connect rows of cells, and bit lines connect columns of cells. Typically CMOS structures include a selection transistor which is electrically connected to the MTJ stack through the top or bottom metal contacts. The direction of the current flow is between top and bottom metal electrode contacts.

Reading the state of the cell is achieved by detecting whether the electrical resistance of the cell is in the high or low state. Writing the cells requires a sufficiently high DC current flowing in the direction through the MTJ stack between the top and bottom metal electrode contacts to induce a spin transfer torque that orients (switches) the free layer into the desired direction. The amount of current needed to write the cells is higher than the current that flows during the read process, so that a read operation does not change the state of the cell.

A memory element of MRAM typically consists of a bottom electrode, a MTJ (Magnetic Tunnel Junction) with a barrier layer such as MgO sandwiched between a top magnetic layer underneath a top electrode (TE) and a bottom magnetic layer on top of a bottom electrode (BE). One of the magnetic layers serves as the free layer with a switchable magnetization, and the magnetization of the reference layer remains fixed in normal operation. In a typical fabrication process the layers of the memory element/device are deposited and patterned, then the back end of line (BEOL) process is performed as a series of steps in which the top electrode is connected to a bit line. The core component of the STT-MRAM (Spin Torque Transfer Magnetic Random Access memory) is the magnetic tunnel junction (MTJ). The resistance area product (RA) and tunnel magnetoresistance (TMR) qualities of the MTJ critically affect the performance of STT-MRAM. The ability to characterize these properties (RA, TMR) during fabrication is important for quality control and reduced overall cost. In the prior art RA and TMR can be characterized both in the sheet film level (before etching) and after back end of line (BEOL) process. However, there is a need for RA and TMR characterization right after MTJ etch process before the wafer moves into BEOL process. Such a characterization ability is important for etching quality control, speeding up production evaluation and reducing development time.

A method that is preferably nondestructive is desired for obtaining timely feedback in the design/research process and for monitoring of fabrication process after the MTJ pillars have been etched on the wafer.

Worledge, et al. have described a method for measuring magnetoresistance (MR) and resistance area product (RA) of unpatterned magnetic tunnel junction film stacks. The RA is measured by making a series of four-point probe resistance measurements on the surface of an unpatterned wafer at various probe tip spacings. The probe tips are spaced apart on the order of microns for typical applications. The MR is obtained by repeating the measurement while applying different magnetic fields. (Worledge, et al.; Magnetoresistance measurement of unpatterned magnetic tunnel junction wafers by current-in-plane tunneling, Applied Physics Letters, Vol. 83, No. 1, 7 Jul. 2003, pp. 84-86; and U.S. Pat. No. 6,927,569.)

Commercially available automated metrology tools (e.g. from CAPRES), which are designed for measuring selected magnetic parameters of unpatterned MTJ film stacks, use multi-point probes with probe tip spacings in the micron range. Four- and twelve-point probes are available for these automated metrology tools. As an example, a CAPRES twelve-point probe is used with a 12-by-4 multiplexor (MUX) to select a total of 495 different pin-configurations each with different probe spacings (pitch). This approach allows the selected tests to be performed with different probe spacings without having to have the tips be movable with respect to each other. Existing automated metrology tools also provide means for applying a selected magnetic field to the test sample.

SUMMARY OF THE INVENTION

Embodiments of the present invention include a wafer with a set of magnetoresistive test devices, such as MTJ devices, which can be fabricated along with arrays of similarly structured memory cells on a production wafer. Measurements of the magnetoresistance (MR) of the test devices can be used for etching evaluation before BEOL processing. The set of MTJ test devices, for example, are representative of the other MTJs in memory arrays on the wafer and include the same layers. However, in embodiments the magnetoresistive test devices have a special shape and size and need not be connected to the any of the control circuitry required for the memory cells. Instead the MTJ test devices are fabricated with metal contact pads at opposite ends of the bottom electrode. Embodiments connecting to the top electrode instead of the bottom electrode can also be implemented according to the principles of the invention. The set of MTJ test devices according to the invention have a measurable magnetoresistance (MR) between the two contact pads that is a function of the magnetic orientation of the free layer and varies with the length and width of the MTJ strip in each test device. Preferably the test MTJs are formed in strips that include a selected range of lengths but a common width and thickness. Measurement of the MR of the MTJ test devices provides data that can be fitted to a theoretical curve to allow the tunnel magnetoresistance (TMR) and resistance area product (RA) of the MTJs in the memory arrays to be estimated or predicted.

TMR being estimated or predicted is the magnetoresistance for the MTJs in the memory arrays, which is usually >80%. The TMR in the MTJs in the memory arrays is a function of the resistance between the top and bottom electrodes (i.e. vertically through the layer stack) in the low and high states. However, the MR of the MTJ test devices in the embodiment is a function of the measured resistance between contact pads at the ends of the bottom electrodes (i.e. horizontally across the bottom electrode) in the low and high states, which is a much smaller effect (e.g. a few percent) but it allows the TMR and RA to be estimated according to the invention. Thus, embodiments of the invention use measurement of resistance across the bottom electrode as a surrogate for the resistance between top and bottom electrodes. Test devices according to the invention can be fabricated more easily by eliminating the need to connect to both top and bottom electrodes.

MTJ test strips on a wafer according to embodiments of the invention are fabricated so that the magnetoresistance (MR) of each MTJ test strip can be measured directly on the wafer by test probes placed in contact with metal pads on the wafer surface. In embodiments the test probe pads are arranged so that standard test probes can be used.

The test process measures the resistances of the test devices between the contact pads in both the high resistance state and the low resistance state. The magnetization of the free layer is switched to be parallel and antiparallel to the reference layer as part of the test process to achieve the low and high resistance states, preferably by applying external magnetic fields to the wafer.

DETAILED DESCRIPTION OF THE INVENTION

In the following description of the embodiments, reference is made to the accompanying drawings that form a part hereof, and in which is shown by way of illustration of the specific embodiments in which the invention may be practiced. It should be noted that the figures discussed herein are not drawn to scale and do not indicate actual or relative sizes. The hatching, if any, in the figures does not represent the type of material used.

Figure 1A:
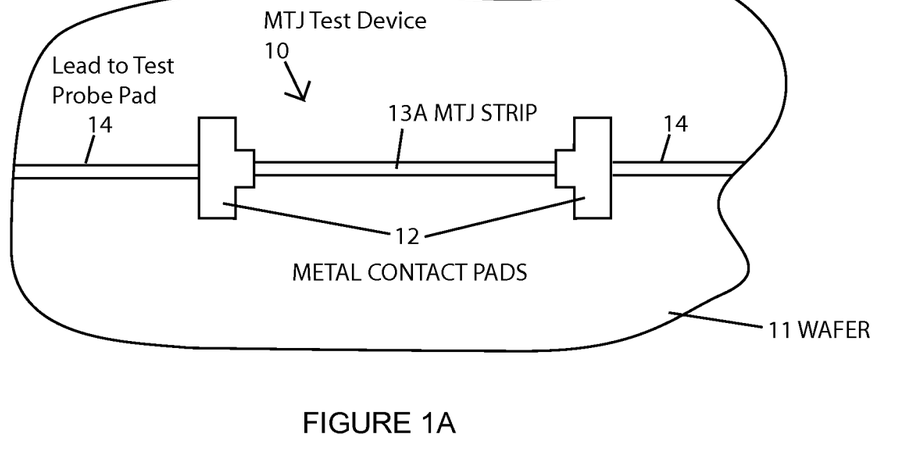
FIG. 1A is an illustration of a top view of one test MTJ device on a wafer with leads to test probe pads according to an embodiment of the invention.
Figure 1B:
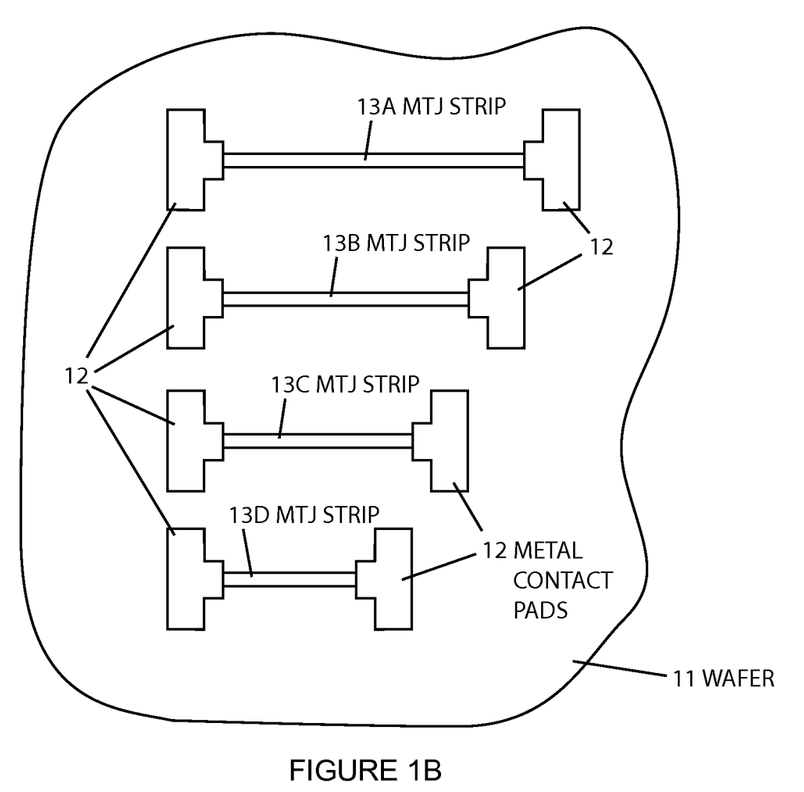
FIG. 1B is an illustration of a top view of a set of test MTJ devices on a wafer according to an embodiment of the invention.

FIG. 1A is an illustration of a top view of one test MTJ device 10 on a wafer 11 with optional leads 14 to test probe pads (not shown) according to an embodiment of the invention. FIG. 1B illustrates a top view of a set of test MTJ devices with MTJ strips 13A-D on a wafer 11. Each strip-shaped MTJ was patterned with electrical connection to the metal contact pads 12 at each end. In general a higher number of test devices will give more accurate results, but practical embodiments can use 4-8 MTJ test devices and achieve reasonable results. These test structures can be formed in an otherwise unused area of the wafer at the same time as production structures or as a standalone wafer for experimentation.

The set of test MTJ devices include functioning MTJ layers (with a switchable free layer) that are representative of the other MTJs in the memory array (not shown) on the wafer and are formed between metal contact pads 12 that are preferably accessible on the surface of the wafer to standard test probes. The metal contact pads in contact with the test MTJs can be further connected by metal leads 14 as shown in FIG. 1A to test probe pads that can be arranged in whatever pattern is needed to be directly accessed by standard electrical test probes. Using surface contact probes, the resistance of each MTJ strip can be easily measured.

Preferably the MTJs in the test devices are formed in relatively long strips that include a selected range of lengths but have a common width and thickness. The width of the test MTJs can be selected to be equal to the feature size of MTJs in the memory array on the wafer. The lengths of MTJ strips in the set, however, are varied, normally in the range of 1-20 microns depending on the expected top and bottom electrode sheet resistance, RA value as well as TMR value. Thus, as an example, the feature size and width of the MTJ test strip could be 65 nm and the lengths of MTJ strips in the set could range from 1-20 microns. In an embodiment with 4 MTJ test strips, lengths could be selected to be 4, 7, 10 and 20 microns, for example.

Figure 2:
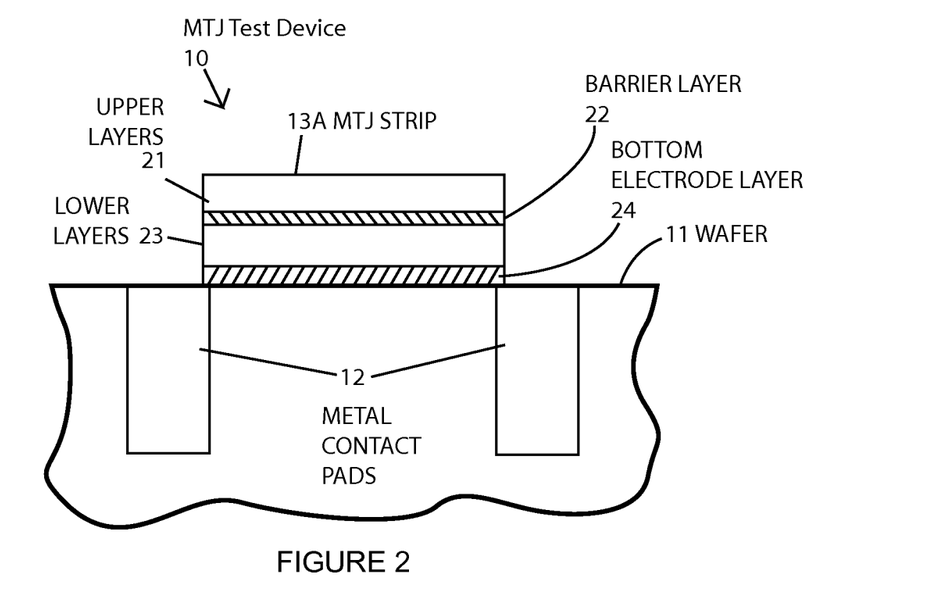
FIG. 2 illustrates a side section view of one MTJ test device perpendicular to the wafer surface.

FIG. 2 illustrates a side section view of one MTJ test device 10 perpendicular to the wafer 11 surface. The MTJ test strip 13A includes upper layers 21 and lower layers 23 which can vary according to the particular MTJ design. The invention does not require a particular MTJ design and, therefore, can be used with various MTJ layer designs. The invention can also be used with MTJs having perpendicular and in-plane magnetizations. A typical MTJ has one free layer and one reference layer, although more complicated structures are known in the prior art and can be used with the test devices according to the invention as well. In the exemplary embodiment described herein the MTJ device is assumed to have one free layer and one reference layer. The upper layers 21 include top metal electrode layer and a free layer or reference layer. The lower layers 23 include the bottom metal electrode layer 24 and a reference layer or free layer. The bottom metal electrode layer 24 will be the first layer deposited in the MTJ layer set. Thus, as shown in FIG. 2, the metal contact pads 12 are making electrical contact with the ends of the bottom metal electrode layer 24 of the MTJ test strip 13A. The barrier layer 22 separates the upper layers 21 and the lower layers 23. The set of MTJ test strips 13A-D are patterned during the etch process that also forms the MTJs in the memory arrays on the wafer.

The measurements according to embodiments of the invention can be made by placing the wafer with MTJ test strips in a standard test fixture. The resistance of each MTJ strip measured between the two ends is a function of the sheet resistance of the upper MTJ $R_U$, the sheet resistance of the lower MTJ $R_L$, the width w and length l of the strip as well as the RA value of the MTJ. The equation for the resistance of the strip can be written as equation 1Q in FIG. 5.

Figure 4:
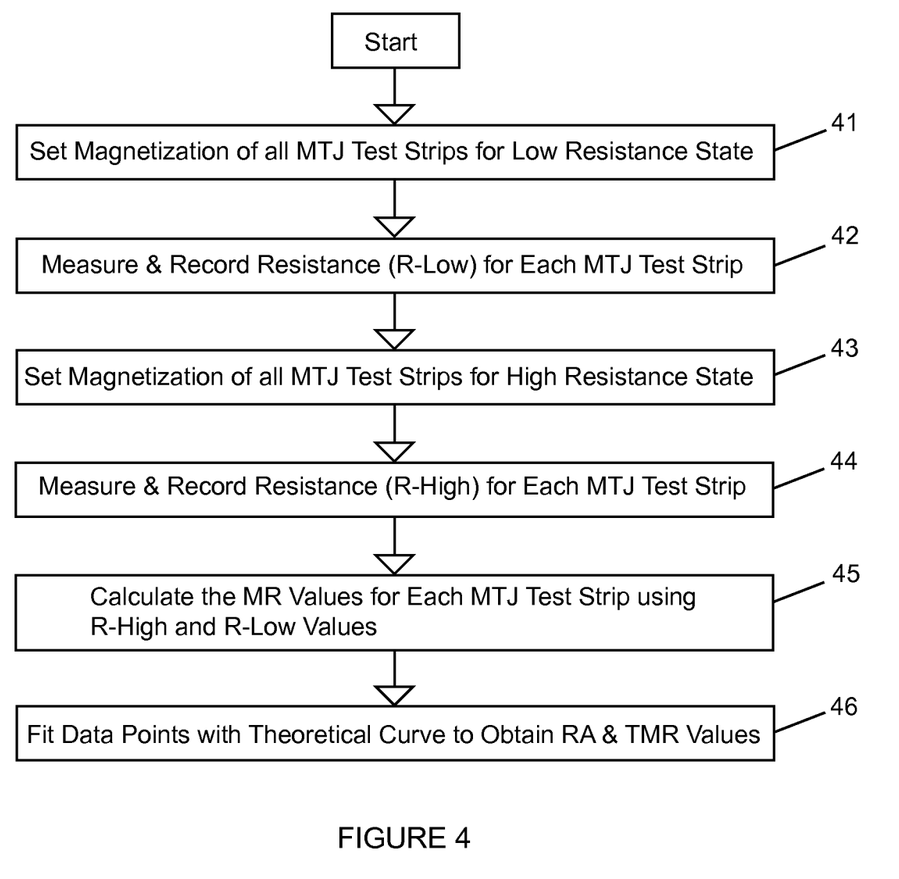
FIG. 4 is a flow chart that describes a third method embodiment using the MTJ strips on a wafer according to the invention.

The test process measures the resistances of the test devices between the contact pads in both the high resistance state and the low resistance state by switching the magnetic orientation of the free layers. FIG. 4 is a flow chart that describes a method of using the MTJ strips on a wafer according to an embodiment of the invention. The magnetization of the free layer is switched as part of the test process, preferably by applying selected external magnetic fields to the wafer. Because the coercivity of the free layer is lower than the reference layer, it can be switched by a magnetic field that will leave the reference layer unswitched. A sufficiently strong magnetic field will switch both layers and can be used to initialize the magnetization direction of the reference layer.

Whether the low or high resistance is measured first does not matter. The embodiment in FIG. 4 first sets the magnetization of the free layers to be parallel to the reference layer and thereby switches the MTJs into the low resistance state 41. Next the resistance between the two metal contact pads is measured and recorded for each MTJ test device 42. In an embodiment of the test setup where the test probe only connects to a single test MTJ device it will be necessary to move the test probe to connect to each pair of test pads. The magnetization of the free layers is next set to be antiparallel to the reference layer and thereby switch the MTJs into the high resistance state 43. The resistance between the two metal contact pads is measured again and recorded for each MTJ test device 44. Alternatively the high and low resistance could be measured for each MTJ test device with the test probe in one position before moving the probe to next test device.

Figure 5:
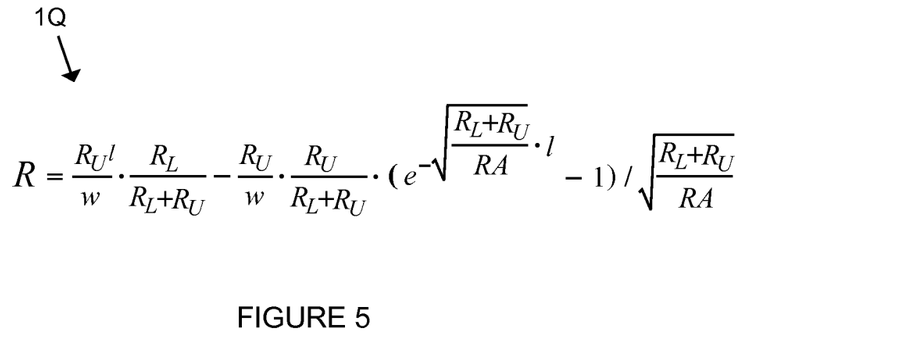
FIG. 5 is an equation for the resistance of a test MTJ strip on a wafer according to the invention.

The resistance of each MTJ test strip depends on the whether the magnetization of the two magnetic layers of the MTJ is in parallel ($R_{low}$) or antiparallel ($R_{high}$) state due to the change of RA value in the equation 1Q in FIG. 5. Therefore, the magneto-resistance (MR) for this strip can be defined as:

$$MR=(R_{high}-R_{low})/R_{low} \qquad (2Q)$$

The method calculates the MR for each test strip using the $R_{high}$ and $R_{low}$ values 45. The MR value for each MTJ strip is a function of the sheet resistance of the upper MTJ layers $R_U$, the sheet resistance of the lower MTJ layers $R_L$, the length l of the strip, the RA and the TMR value of the MTJ.

Figure 3A:
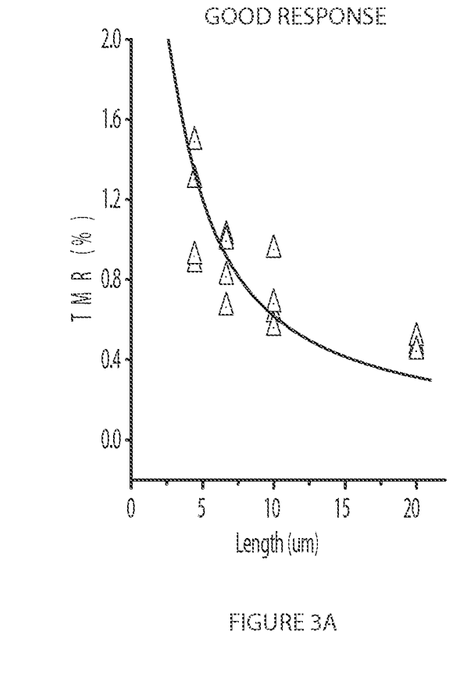
FIG. 3A is a graph of an example of experimental data of the TMR versus the strip length for a selected test device that shows relatively good TMR response. The solid line is the theoretical idea curve.

An example of the TMR versus the strip length experimental data and theoretical curve (solid line) is given in FIG. 3A, where data for a device that shows relatively good TMR response is shown. The theoretical curve is a best fit of the experimental data to the two equations 1Q, 2Q. In an embodiment of the method the RA and TMR values are not found as a result of calculation but instead, are found by fitting the parameters of the theoretical curve as illustrated in FIG. 3A. Some assumptions that are implied include: a) top and bottom electrodes have good conductivity, and therefore, the voltage drop in the vertical direction of the electrodes can be ignored compared to the voltage drop across the tunnel barrier; and b) current flows only vertically through the barrier. These assumptions are generally true in the case of MTJ devices. Therefore, the best fitting theoretical curve for the data as shown in FIG. 3A would give the RA and TMR value. Therefore, if the resistance value for a series of MTJ strips with different lengths is measured, these data points can be fitted with the theoretical curve to obtain the RA and TMR value for MTJ 46 as illustrated in the flow chart in FIG. 4.

Figure 3B:
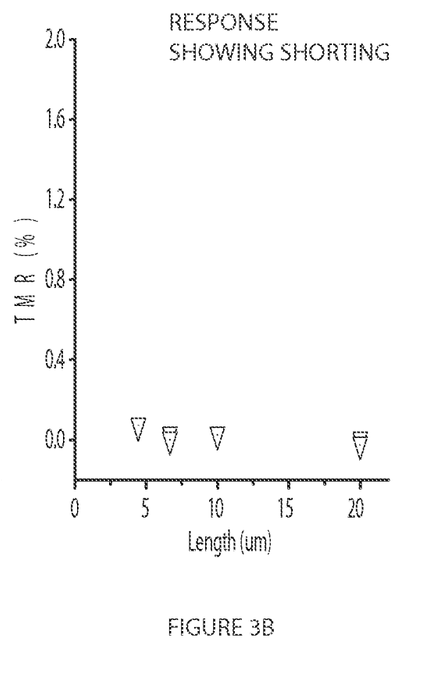
FIG. 3B is a graph of an example of experimental data of the TMR versus the strip length for a selected failing test device that shows serious shorting.

The data in FIG. 3A includes points for 4 sets of test strips with 4 different lengths. In contrast, FIG. 3B shows sample data for a failing device with serious shorting across the barrier layer which causes the resistance to be independent of the magnetization of the free layer. In this example each of the TMR values for the test strips is below the expected value. In other cases some of the test strips might indicate low/failing TMR while others yielded the expected value. Thus, one can easily identify MTJ shorting region/wafer based on the method of the invention.

The measured high and low resistance data for the MTJ test strips provides valuable information on the quality of the fabrication process as well as the design. As one example, the test data can be used with selected thresholds as suggested by FIGS. 3A and 3B for screening out defective wafers.

The invention claimed is:

1. A method of testing magnetoresistive devices on a wafer:
    fabricating a set of magnetoresistive test devices on the wafer that includes magnetoresistive test devices having a plurality of lengths as measured along a surface plane of the wafer, with each magnetoresistive test device having a high and a low electrical resistance state as measured through a plurality of layers in the magnetoresistive test device that depends on a switchable first and second magnetization orientations of a free magnetic layer and each test device including an electrode layer that spans between and makes electrical contact with a corresponding pair of electrically conductive pads;
    applying a first selected magnetic field to the set of magnetoresistive test devices to set the free magnetic layers to have the first magnetization orientation;
    measuring a first electrical resistance between the corresponding pair of electrically conductive pads for each of the magnetoresistive test devices while the free magnetic layer has the first magnetization orientation;
    applying a second selected magnetic field to the set of magnetoresistive test devices to set the free magnetic layers to have the second magnetization orientation;
    measuring a second electrical resistance between the corresponding pair of electrically conductive pads for each of the magnetoresistive test devices while the free magnetic layer has the second magnetization orientation; and
    calculating a magnetoresistance value for each magnetoresistive test device.

2. The method of claim 1 wherein measuring the first electrical resistance further comprises placing a test probe in contact with electrically conductive pads on a surface of the wafer that are electrically connected to the corresponding pair of electrically conductive pads.

3. The method of claim 1 further comprising comparing the magnetoresistance values for the magnetoresistive test devices with predetermined thresholds to determine whether electrical shorting exists in the magnetoresistive test devices.

4. The method of claim 1 further comprising using the first and second electrical resistance values corresponding to first and second magnetization orientations of the free layer, the magnetoresistance values and the corresponding lengths for the set of magnetoresistive test devices to derive a magnetoresistance curve.

5. The method of claim 1 further comprising using the first and second electrical resistance values corresponding to first and second magnetization orientations of the free layer, the magnetoresistance values and the corresponding lengths for the set for the magnetoresistive test devices to derive a resistance area product.

6. The method of claim 1 wherein the wafer includes a plurality of magnetic tunnel junction memory devices that are arranged in an array and have a layer structure that is substantially equal to a layer structure of the magnetoresistive test devices and wherein the magnetoresistance values for the set of magnetoresistive test device are used to test of quality of preceding fabrication steps before executing additional fabrication steps.

7. The method of claim 6 further comprising performing a series of process steps to connect the magnetic tunnel junction memory devices in the array to bit lines.

8. The method of claim 6 wherein one magnetic tunnel junction test device has a length measured along a line between the corresponding pair of electrically conductive contact pads that is substantially greater than a feature size of the magnetic tunnel junction memory devices that are arranged in the array.

9. The method of claim 6 wherein the magnetoresistive test devices are formed in strips that have a length measured along a line between the corresponding contact pads that is substantially greater than a width measured perpendicular to the line.

* * * * *